US008625261B2

(12) United States Patent
Chin et al.

(10) Patent No.: US 8,625,261 B2
(45) Date of Patent: Jan. 7, 2014

(54) INTERLOCKING SYSTEM FOR CONNECTING A PROGRAMMABLE LOGIC CONTROLLER AND A POWER SUPPLY

(75) Inventors: Karen Chin, Singapore (SG); Chee Lim Wong, Singapore (SG)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 208 days.

(21) Appl. No.: 13/178,328

(22) Filed: Jul. 7, 2011

(65) Prior Publication Data

US 2012/0008279 A1 Jan. 12, 2012

(51) Int. Cl.
*G06F 1/16* (2006.01)
(52) U.S. Cl.
USPC .... 361/679.01; 345/173; 248/454; 312/107.5
(58) Field of Classification Search
USPC ............ 345/1.3, 131, 173; 348/148; 206/534; 248/220.22, 228.11, 309.1, 349.1, 454; 361/797, 798, 679.58, 679.02, 679.31, 361/679.32, 679.33, 679.46, 679.48, 361/679.01; 312/219, 221; 348.4, 330.1, 312/348.1, 111, 319.4, 107.5, 247; 165/104.25, 138
See application file for complete search history.

(56) References Cited

U.S. PATENT DOCUMENTS

| 6,418,027 | B1 * | 7/2002 | Suzuki et al. | 361/729 |
| 2010/0238289 | A1 * | 9/2010 | Wu | 348/148 |
| 2012/0127103 | A1 * | 5/2012 | Qualey et al. | 345/173 |
| 2012/0223872 | A1 * | 9/2012 | Ram | 345/1.3 |

* cited by examiner

*Primary Examiner* — Hung Duong
(74) *Attorney, Agent, or Firm* — Fletcher Yoder, P.C.; R. Scott Speroff; John M. Miller

(57) ABSTRACT

An interlocking system for connecting a programmable logic controller and a power supply of an industrial control and automation system is provided. The interlocking system includes features configured to facilitate coupling with a panel or rail and a plurality of vertical slots and a latch disposed on a side surface of the power supply. The latch includes a first attachment feature disposed along a flexible tongue cantilevered proximate an opening in a housing of the power supply such that the tongue can flex into the opening. The interlocking system also includes a plurality of hooks and a second attachment feature formed on a side surface of the programmable logic controller. The plurality of hooks are configured to slide along and engage with the plurality of vertical slots such that the programmable logic controller and the power supply are held together horizontally and the second attachment feature is configured to couple with the first attachment feature to resist disengagement of the plurality of hooks and the plurality of vertical slots.

15 Claims, 5 Drawing Sheets

INTERLOCKING SYSTEM FOR CONNECTING A PROGRAMMABLE LOGIC CONTROLLER AND A POWER SUPPLY

CROSS REFERENCE TO RELATED APPLICATIONS

This application claims priority from and the benefit of Singapore Patent Application No. 201004955-9, filed on Jul. 8, 2010; entitled "Interlocking System for Connecting a Programmable Logic Controller and a Power Supply", which is herein incorporated by reference.

BACKGROUND

The invention relates generally to industrial automation and control systems, such as those used in industrial and commercial settings. More particularly, embodiments of the present invention relate to techniques for interlocking modules of such systems.

Industrial automation and control systems are known and are in use for controlling factory automation and the like. Such systems include various components such as programmable logic controllers, semiconductor power electronic circuits, power supplies, motor starters, relays etc. that are utilized to monitor and control a process/system. Typically, the programmable logic controller examines a series of inputs reflecting the status of a controlled process and changes outputs affecting control of the controlled process.

In traditional automation and control systems, various components, such as controllers and power supplies, of the system are interconnected together as modules. These modules are often assembled by mounting the components to panels housed in large electrical enclosures. Certain components cooperate with other components to expand functionality. For example, industrial controllers may provide for connection of additional I/O modules to add input and output functionality to the controller. Indeed, adding an I/O module may allow the industrial controller to interface with a specific type of control equipment.

In traditional automation and control systems, the components/modules are connected using interlocking systems that utilize numerous mechanical parts for locking the modules together. It is now recognized that the mechanical parts of such interlocking systems can be cumbersome, delicate, and expensive. Furthermore, the complex nature of such systems typically requires significant manipulation by a user to activate. For example, a typical interlocking system for components of a control system may require at least three actions for the assembly of the components such as sliding the components and activating various different locking mechanisms.

Accordingly, it is now recognized that it is desirable to develop an interlocking system for securing modules that provides a rigid connection between the modules while facilitating the alignment of such modules.

BRIEF DESCRIPTION

According to one embodiment of the present invention, an interlocking system for connecting a programmable logic controller and a power supply of an industrial control and automation system is provided. The interlocking system includes a plurality of vertical slots and a latch disposed on a side surface of the power supply. The latch includes a first attachment feature disposed along a flexible tongue cantilevered proximate an opening in a housing of the power supply such that the tongue can flex into the opening. The interlocking system also includes a plurality of hooks and a second attachment feature formed on a side surface of the programmable logic controller. The plurality of hooks are configured to slide along and engage with the plurality of vertical slots such that the programmable logic controller and the power supply are held together horizontally and the second attachment feature is configured to couple with the first attachment feature to resist disengagement of the plurality of hooks and the plurality of vertical slots.

In accordance with another aspect, an industrial automation and control system is provided. The industrial automation and control system includes an enclosure and a plurality of monitoring and/or control modules disposed within the enclosure. The modules are configured to perform a monitoring and/or control function for a process. The adjacent monitoring and/or control modules are connected using a plurality of hooks and corresponding vertical slots on mating surfaces of the adjacent modules. Further, the adjacent modules are secured using a latch and a receiving slot of the mating surfaces of the modules.

In accordance with another aspect, a method for connecting a power supply to a programmable logic controller is provided. The method includes aligning a mating surface of the programmable logic controller and a mating surface of the power supply and slidably engaging a plurality of hooks extending from one of the mating surfaces with corresponding vertical slots formed in the other of the mating surfaces. The method also includes engaging a latch cantilevered from the one of the mating surfaces with an attachment feature of the other mating surface such that the plurality of hooks and vertical slots are substantially prevented from slidably disengaging.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present technique function to provide an interlocking system for connecting modules such as a programmable logic controller and a power supply of an industrial control and automation system. In particular, the present technique provides features with slide and auto-locking mechanism that facilitate assembly of such modules in a single assembly action.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
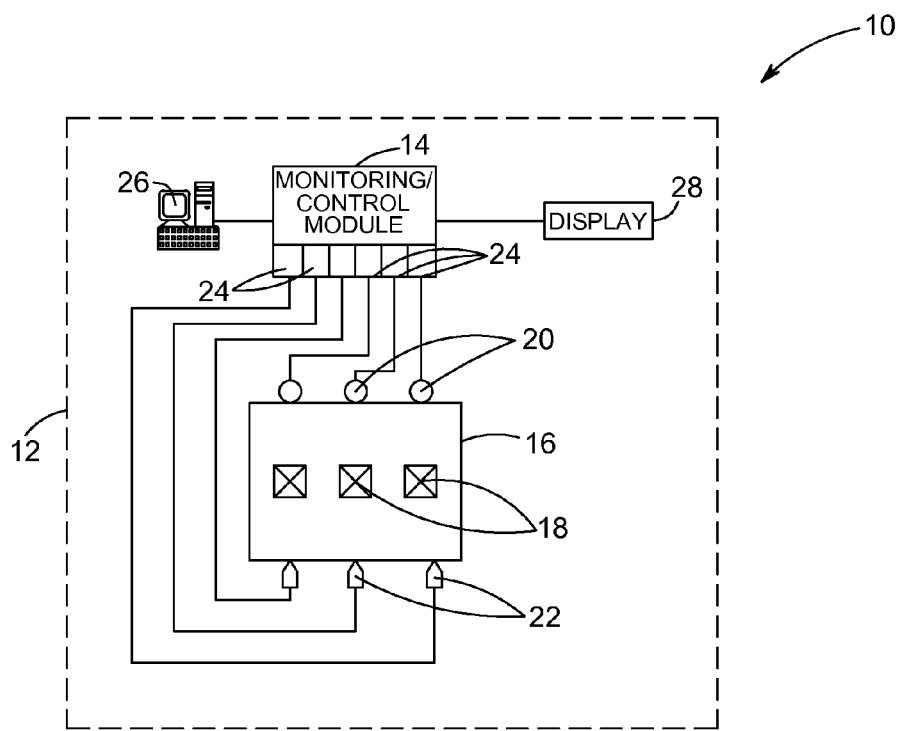
FIG. 1 illustrates an exemplary industrial automation and control system in accordance with aspects of the present technique.

Turning now to the drawings and referring first to FIG. 1 an exemplary industrial automation and control system 10 is illustrated. The system 10 includes an enclosure 12, such as an electrical cabinet, in which electrical components such as monitoring and/or control components are housed. Example components in the unit may include relays, motor starters, and programmable logic controllers (PLC), among others.

The enclosure 12 may be suitable, for example, for assembly of a motor control center or use with industrial, commercial, marine, or other electrical systems. The enclosure 12 may be made of any suitable material, such as heavy gage sheet metal, reinforced plastics, and so forth. In certain embodiments, the enclosure 12 includes individual compartments or other structures that support the electrical components.

In the illustrated embodiment, the system 10 includes a monitoring/control module 14 assembled in accordance with present techniques and adapted to interface with components of a machine system/process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process/system 16 may take many forms and include devices for accomplishing many different and varied purposes. For example, the process/system 16 may comprise a compressor station, an oil refinery, a batch operation for making food items, a mechanized assembly line, and so forth. Accordingly, the process/system 16 may comprise a variety of operational components generally represented by reference numeral 18, such as electric motors, valves, actuators, temperature elements, pressure sensors, or a myriad of manufacturing, processing, material handling and other applications.

Further, the process/system 16 may comprise control and monitoring equipment for regulating process variables through automation and/or observation. For example, the illustrated process/system 16 comprises sensors 20 and actuators 22. The sensors 20 may comprise any number of devices adapted to provide information regarding process conditions. The actuators 22 may include any number of devices adapted to perform a mechanical action in response to an input signal.

As illustrated, these sensors 20 and actuators 22 are in communication with the monitoring/control module 16 (e.g., a programmable logic controller). In one embodiment, the sensors 20 and actuators 22 may communicate with the monitoring/control module 14 via one or more I/O modules 24 coupled to the monitoring/control module 14. The I/O modules 24 may transfer input and output signals between the monitoring/control module 14 and the controlled process/system 16.

In certain embodiments, these devices (sensors 20 and actuators 22) may be utilized to operate process equipment. Indeed, they may be utilized within process loops that are monitored and controlled by the process/system 16. Such a process loop may be activated based on process inputs (e.g., input from a sensor 20) or direct operator input received through a user interface device 26.

The I/O modules 24 may be integrated with the control/monitoring device 14, or may be added or removed via expansion slots, bays or other suitable mechanism. For example, to add functionality to the control/monitoring device 14, additional I/O modules 24 may be added, such as if new sensors 20 or actuators 22 are added to control the process/system 16. These I/O modules serve as an electrical interface to the controller and may be located proximate or remote from the controller including remote network interfaces to associated systems.

The I/O modules 24 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O modules 24 may convert between AC and DC analog signals used by devices on a controlled machine or process and +5-volt DC logic signals used by the controller. Additionally, some of the I/O modules 24 may provide digital signals to digital I/O devices and received digital signals from digital I/O devices. Further, in some embodiments, the I/O modules 24 that are used to control motion devices or process control devices may include local microcomputing capability on the I/O module.

In some embodiments, the I/O modules 24 may be located in close proximity to a portion of the control equipment, and away from the remainder of the controller. Data is communicated with remote modules over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet. or other network protocols (Foundation Fieldbus (H1 and Fast Ethernet) Modbus TCP, Profibus) and also communicate to higher level computing systems In the illustrated embodiment, the system 10 also includes a display 28 such as an LCD or other display configured to display output parameters such as operating parameters of the process/system 10, temperature and pressures sensed by the sensors 20, position information of the actuators 22 and so forth.

In the illustrated embodiment, adjacent modules of the system 10, such as components of the monitoring/control module 14, are connected using an interlocking system in accordance with present techniques. The interlocking system includes features on mating surfaces of the modules for securing the modules together as will be described below with reference to FIGS. 2-7.

Figure 2:
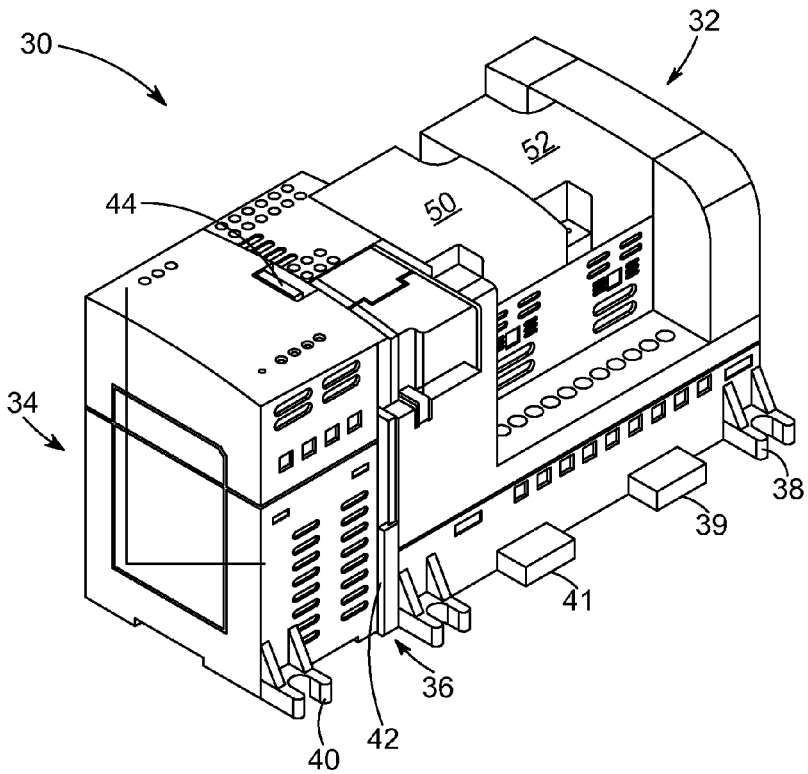
FIG. 2 is a perspective view of an assembly having two modules coupled using an interlocking system in accordance with aspects of the present technique.

FIG. 2 is a perspective view of an assembly 30 having two modules 32 and 34 coupled together using an interlocking system 36. In this exemplary embodiment, the module 32 includes a programmable logic controller and the module 34 includes a power supply. Specifically, in the illustrated embodiment, the power supply 34 is a 24 volts AC power supply configured to power the programmable logic controller 32. As illustrated, the programmable logic controller 32 and the power supply 34 each include a variety of components and features that facilitate assembly and/or operation of the logic controller 32 and power supply 34. For example, the assembly 30 may include any number of slots, vents, plugs, connectors, or other interface structures. Such structures may facilitate operation of the assembly 30, coupling between assembly components, coupling with other features (e.g., a DIN rail), and/or operation of the assembly 30. Certain features of the assembly 30 may be coupled (e.g., via plug-in connections) to a backplane that provides for distribution of power and data signals. Such backplanes are currently in use throughout industrial applications to provide data and control signals to and from programmable logic controllers, computer components and peripherals, and so forth.

In this exemplary embodiment, the interlocking system 36 includes coupling features such as hooks, slots, and other structures for securing the programmable logic controller 32 and the power supply 34 together. It should be noted that when the power supply 34 and the programmable logic controller 32 are coupled together, as illustrated in FIG. 2, certain aspects of these attachment features are hidden from view. Accordingly, these attachment features are described in more detail below with reference to FIGS. 3 and 4, wherein the programmable logic controller 32 and the power supply 34 are illustrated separate from one another. However, certain attachment features can be seen in FIG. 2. For example, the programmable logic controller 32 includes hooks 42 that are engaged with slots (not shown) on the power supply 34. The engagement between the hooks 42 and the slots may be achieved by sliding the hooks 42 and slots together and then holding them in place relative to one another with another attachment feature.

For example, the power supply 34 includes a flexible tongue or tab 44 that is configured to engage a corresponding feature of the programmable logic controller 32 to resist or prevent sliding of the hooks 42 along the slots. In other words, when the tab 44 is engaged, it may prevent the hooks 42 and slots from becoming disengaged by preventing them from sliding relative to one another. As can be seen in FIG. 2, the tab 44 is easily accessible to a user. Indeed, a user can simply press the tab 44 such that it flexes away from engagement, allowing the user to slidably disengage the power supply 34 and the programmable logic controller 32.

In the embodiment illustrated by FIG. 2, the assembly 30 also includes features configured to facilitate attachment of the assembly 30 to a support (e.g., a wall of an electrical cabinet). Specifically, FIG. 2 includes attachment features such as indicated by reference numerals 38 and 40 disposed on the programmable logic controller 32 and the power supply 34 respectively. Such attachment features are configured to facilitate coupling of the programmable logic controller 32 and the power supply 34 with a panel or a rail (not shown). For example, in certain embodiments, the programmable logic controller 32 and the power supply 34 may be secured to an electrical cabinet using fasteners that pass through the attachment features 38 and 40 into a back panel of the electrical cabinet. In other embodiments, other attachment features such as represented by reference numerals 39 and 41 are configured to couple these components with DIN rails.

With regard to attachment of the assembly 30 to a support, the interlocking system 36 facilitates coupling of the programmable logic controller 32 and the power supply 34 separate from the support and then subsequent attachment of the assembly 30 to the support as a unit. For example, a user can couple the programmable logic controller 32 together with the power supply 34 outside of a cabinet and then install them together within the cabinet as a single assembly 30.

In certain embodiments, the programmable logic controller 32 and the power supply 34 may include expansion and communication features. For example, the assembly 30 may include interface slots, communication ports, and receptacles configured to receive one or more screws or other fasteners to secure them to the panel. Specifically, for example, in the illustrated embodiment, the programmable logic controller 32 includes ports to receive programmable modules such as represented by reference numerals 50 and 52. These programmable modules 50 and 52 are adapted to manage aspects of the programmable logic controller 32. As will be appreciated by those skilled in the art, a variety of such modules may be coupled to the programmable logic controller 32 for performing the control/monitoring function of a specified process and/or a machine system.

Figure 3:
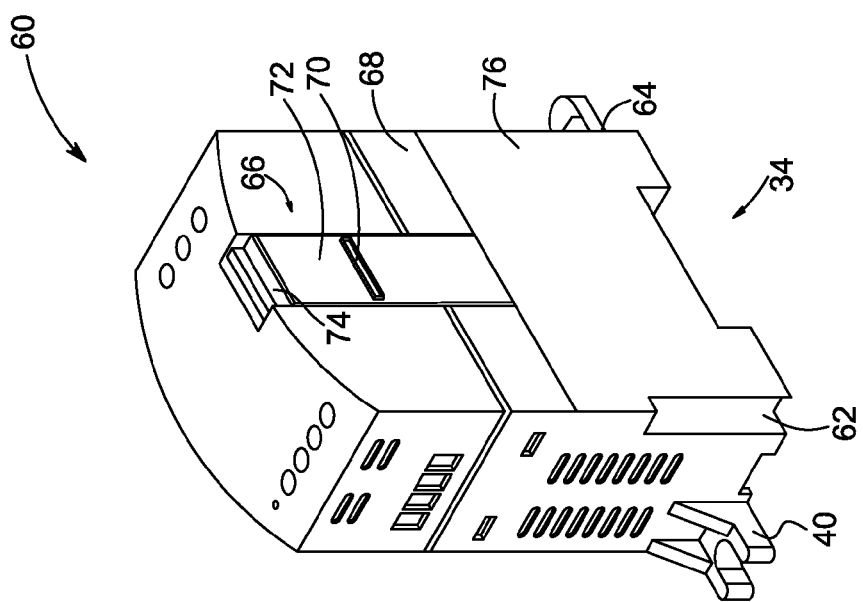
FIG. 3 illustrates an exemplary configuration of the power supply of the assembly of FIG. 2 in accordance with aspects of the present technique.

FIG. 3 illustrates an exemplary configuration 60 of the power supply 34 of the assembly 30 illustrated in FIG. 2. In the illustrated embodiment, the power supply 34 includes a plurality of vertical slots such as represented by reference numerals 62 and 64. Furthermore, a tab or latch 66 is disposed on a side surface 68 (mating surface) of the power supply 34. The vertical slots 62 and 64 and the latch 66 facilitate assembly of the power supply 34 and the programmable logic controller 32 while providing a rigid connection between the power supply 34 and the programmable logic controller 32. It should be noted that while, in this exemplary embodiment, the power supply 34 includes two vertical slots 62 and 64 formed adjacent to edges of the side surface 68 of the power supply 34, in other embodiments, the number and size of the vertical slots may be configured based upon the size of the power supply 34 and the programmable logic controller 32. Such slots may be formed using any suitable machining or molding techniques and may be formed in the power supply 34 to conserve space in the programmable logic controller 32. However, in some embodiments, such slots may be formed in the programmable logic controller 32 with corresponding hooks on the power supply 34.

The latch 66 includes a first attachment feature 70 disposed along a flexible tongue 72 that is cantilevered proximate an opening 74 in a housing 76 of the power supply 34 such that the tongue 72 can flex into the opening 74. In this exemplary embodiment, the first attachment feature 70 includes a detent. However, in other embodiments the first attachment feature 70 may include a receptacle, a pin, a snap, or the like. Again, the size of the first attachment feature 70 may be determined based upon the size of each of the power supply 34 and the programmable logic controller 32 and the material of the latch 66. In one exemplary embodiment, the latch 66 is formed of a plastic material. However, other suitable materials may be employed for the latch 66 as well. It should be noted that, in the illustrated embodiment, the latch 66 is an extension of the housing 76 of the power supply 60. However, the latch 66 may be individually fabricated and coupled to the side surface 68 of the housing 76 using a suitable adhesive, or through a bolted coupling. Additionally, the latch 66 can be disposed on the programmable logic controller 32 in some embodiments. However, including the latch 66 as a component of the power supply 34 conserves space in the programmable logic controller 32.

Figure 4:
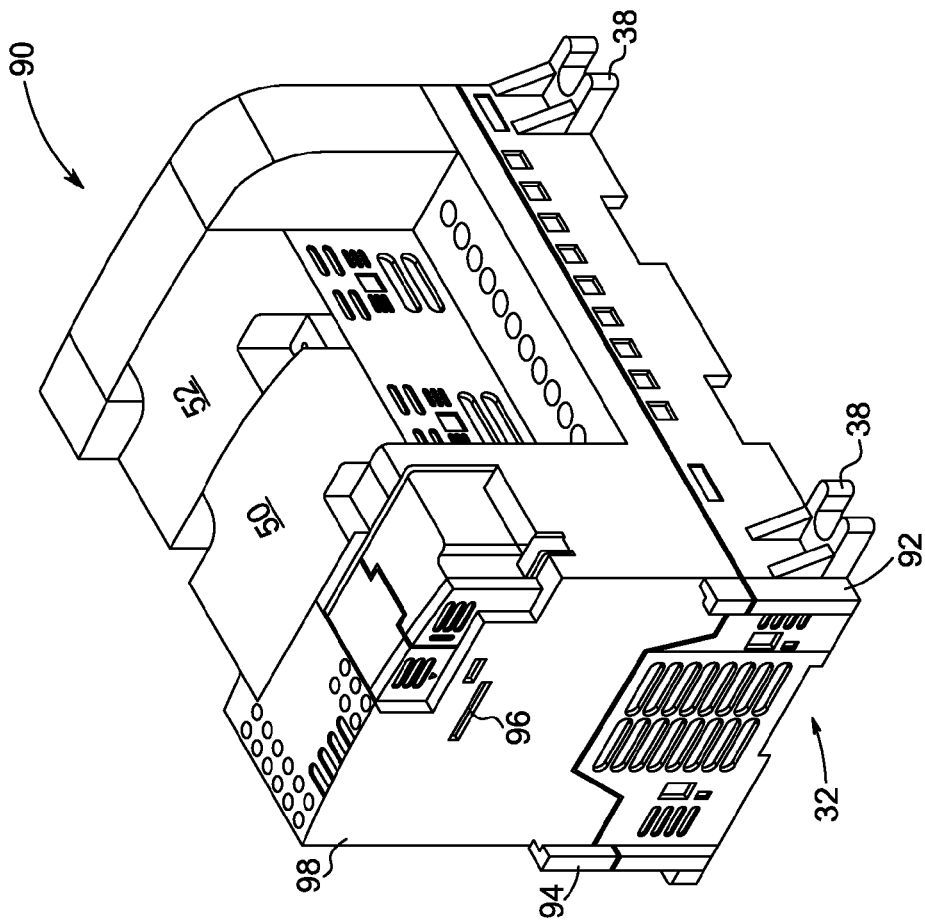
FIG. 4 illustrates an exemplary configuration of the programmable logic controller of the assembly of FIG. 2 in accordance with aspects of the present technique.

FIG. 4 illustrates an exemplary configuration 90 of the programmable logic controller 32 of the assembly 30 illustrated in FIG. 2. As illustrated, the programmable logic controller 32 includes a plurality of hooks such as represented by reference numerals 92 and 94 and a second attachment feature 96 disposed on a side surface 98 of the programmable logic controller 32. As with the vertical slots of the power supply 60 of FIG. 3, the number and size of the hooks is configurable based upon the size of the programmable logic controller 32 and the power supply 34.

In this exemplary embodiment, the hooks 92 and 94 of the programmable logic controller 32 are configured to slide along and engage with corresponding vertical slots 62 and 64 of the power supply 34 such that the programmable logic controller 32 and the power supply 34 are held together horizontally. Moreover, the second attachment feature 96 is configured to couple with the first attachment feature 70 of the power supply 34 to resist disengagement of the hooks 92 and 94 and the vertical slots 62 and 64. In other words, once the hooks 92 and 94 are engaged with the slots 62 and 64, the engagement of the first attachment feature 70 with the second attachment feature prevents vertical movement, and, thus, prevents decoupling of the hooks 92 and 94 from the slots 62 and 64. In this exemplary embodiment, the second attachment feature 96 includes a lug configured to receive the detent 70 of the power supply 34. However, in other embodiments, the second attachment feature 96 may include different physical characteristics.

The exemplary configurations 60 and 90 of the power supply 34 and the programmable logic controller 32 illustrate single first and second attachment features 70 and 96 disposed at pre-determined locations on the power supply 34 and the programmable logic controller 32 respectively. However, a plurality of such attachment features may be employed in certain other embodiments.

Figure 5:
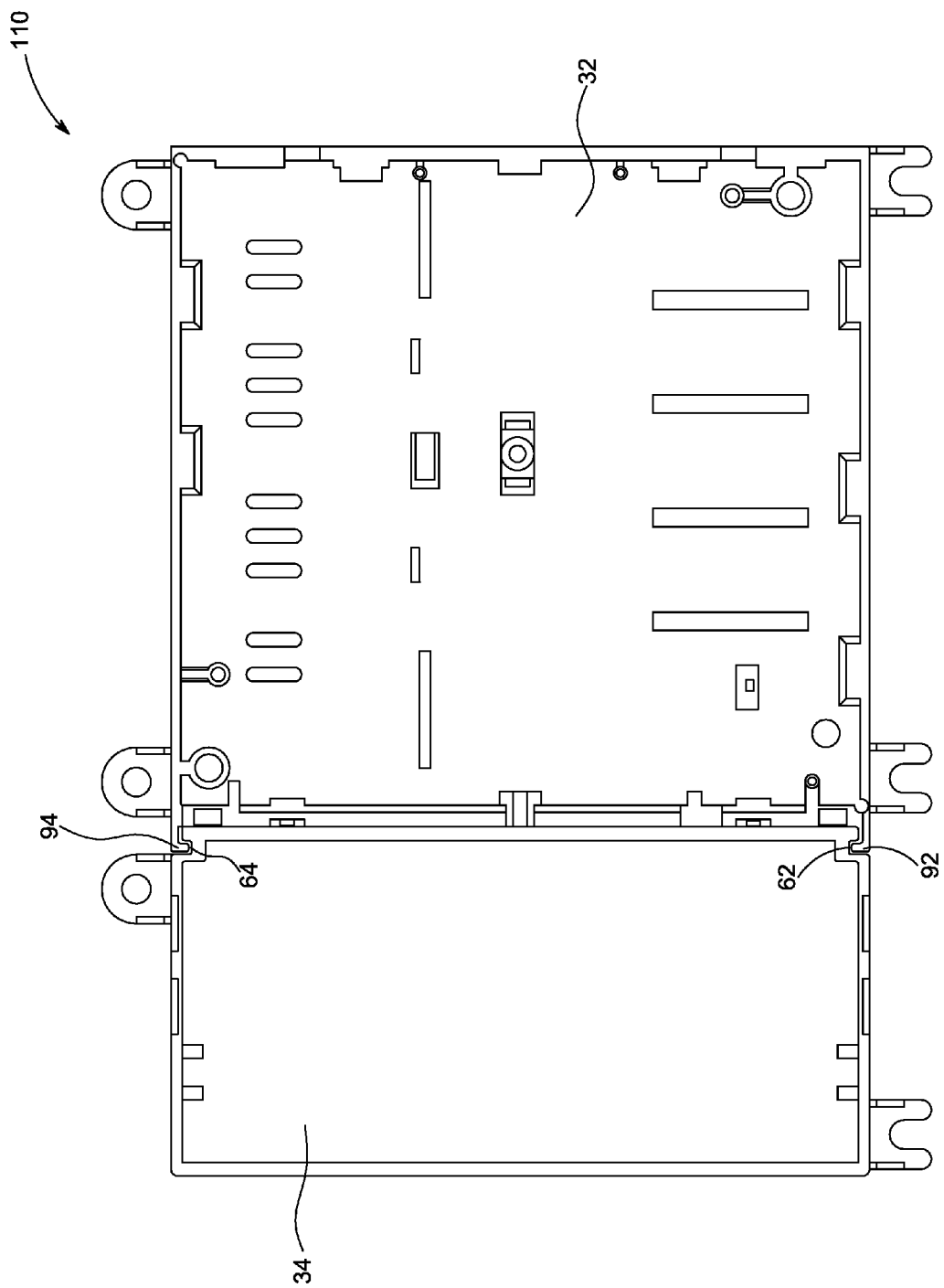
FIG. 5 is a cross-sectional plan view of the assembly of FIG. 2 with the power supply and the programmable logic controller secured using hooks and vertical slots of FIGS. 3 and 4.
Figure 6:
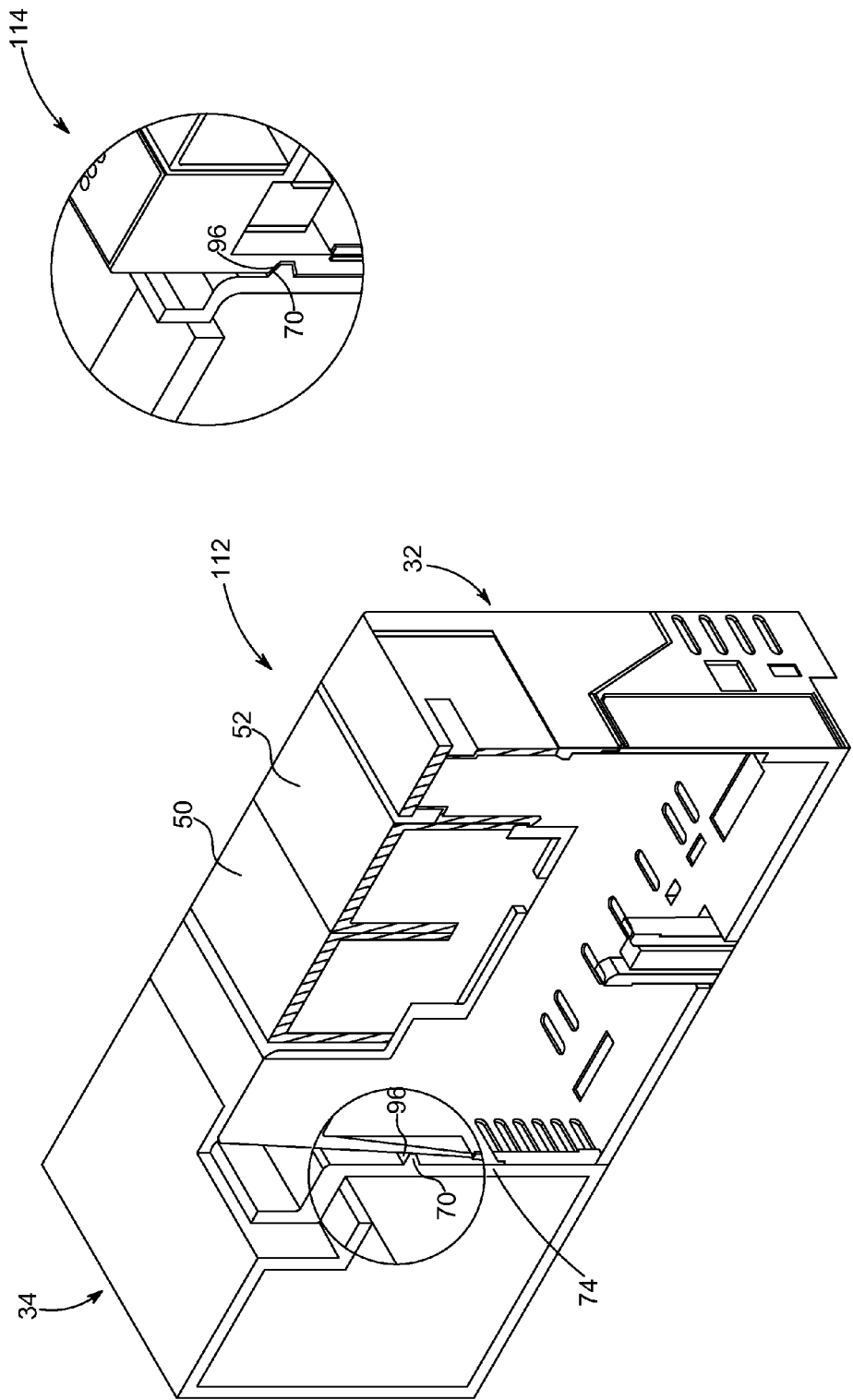
FIG. 6 is a cross-sectional perspective view of the assembly of FIG. 2 with the power supply and the programmable logic controller secured using latch and attachment feature of FIGS. 3 and 4.

FIGS. 5 and 6 are cross-sectional views 110 and 112 of the assembly 30 of FIG. 2 with the power supply 34 and the programmable logic controller 32 secured using the coupling or attachment features described above. As illustrated, in configuration 110 the hooks 92 and 94 of the programmable logic controller 32 are engaged with the slots 62 and 64 of the power supply 34.

In operation, the hooks 92 and 94 are configured to slide along and engage with the slots 62 and 64 respectively during the assembly operation. Moreover, the first attachment feature 70 of the latch 66 of the power supply 34 slidably engages with the second attachment structure 96 of the programmable logic controller 32 in response to the same sliding movement of the power supply 34 relative to the programmable logic controller 32 that facilitates engagement of the hooks 92 and 94 with the slots 62 and 64.

As described before, the first attachment feature 70 is disposed along a flexible tongue that flexes to facilitate engagement of the first attachment feature 70 with the second attachment feature 96 of the programmable logic controller 32. In this exemplary embodiment, a sound is generated by engagement of the latch 66 with the second attachment structure 96, which alerts a user to such an engagement. Further, it should be noted that the latch 66, the second attachment feature 96, the vertical slots 62 and 64 and the hooks 92 and 94 facilitate alignment and securing together of the programmable logic controller 32 and the power supply 34 in a single assembly action thereby eliminating the need of multiple assembly operations for alignment and locking functions. Advantageously, the assembly using the single action described above eliminates separate locking mechanism thereby resulting in added efficiency relative to traditional techniques and cost savings.

Figure 7:
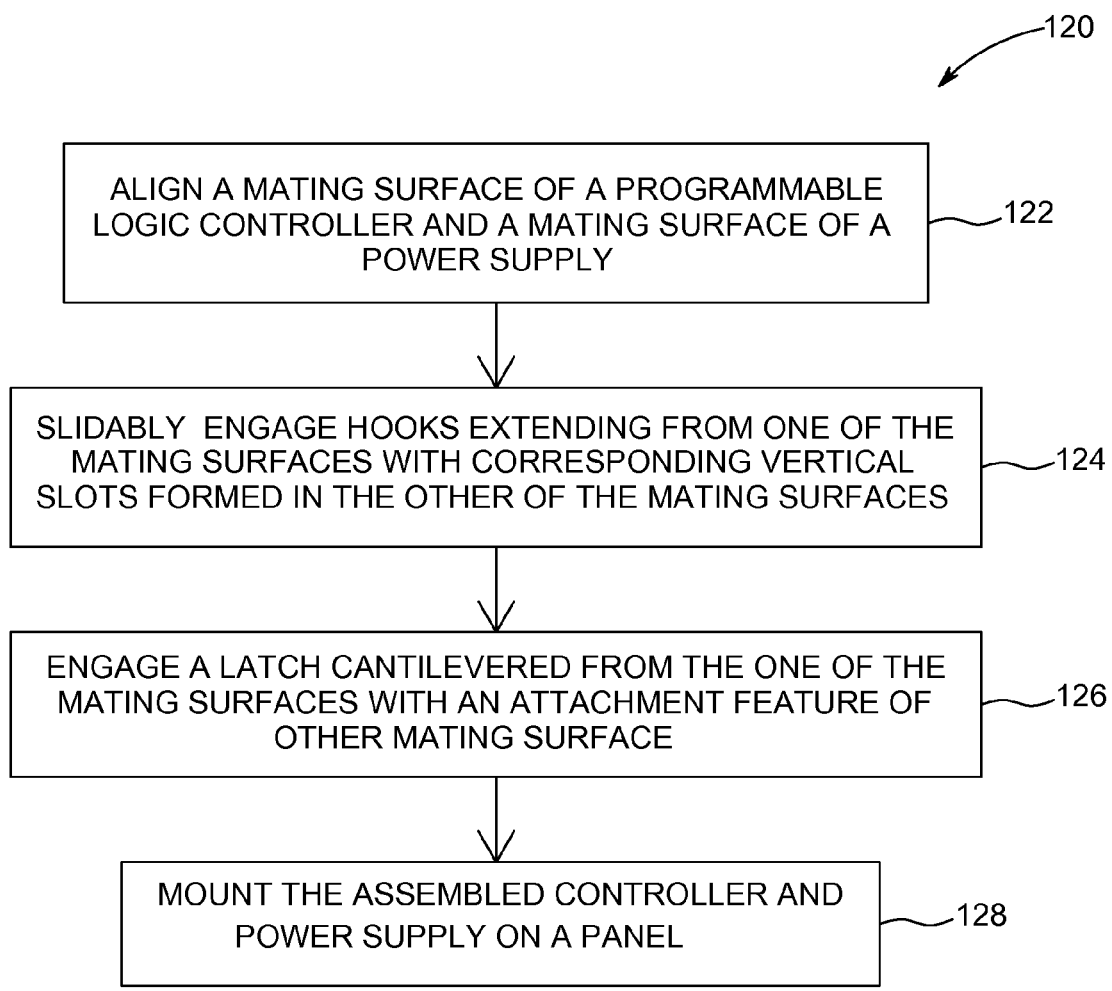
FIG. 7 illustrates a process flow diagram representing an exemplary method for connecting two modules such as the power supply and the programmable logic controller of FIG. 2 in accordance with aspects of the present technique.

FIG. 7 illustrates an exemplary method 120 for connecting two modules together such as the power supply 34 and the programmable logic controller 32 of FIG. 2. At block 122, a mating surface of the programmable logic controller is aligned with a mating surface of the power supply. In one exemplary embodiment, an operator performing the assembly of these modules determines the mating surfaces of the programmable logic controller and the power supply by observing the attachment features and then aligns them such that one mating surface abuts the other mating surface.

Further, hooks extending from one of the mating surfaces are slidably engaged with corresponding vertical slots formed in the other of the mating surfaces, as represented by block 124. In this exemplary embodiment, the hooks extend from the mating surface of the programmable logic controller. At block 126, a latch cantilevered from the one of the mating surfaces is engaged with an attachment feature of the other mating surface such that the hooks and the vertical slots are substantially prevented from slidably disengaging and such that an audible snap is generated by engagement. Moreover, the assembled controller and the power supply are mounted on a support (e.g., an electrical panel) using suitable coupling techniques, as represented by block 128.

The various aspects of the structures described hereinabove may be used for connecting adjacent monitoring/control modules, such as those typically found in industrial automation and control systems. As described above, the technique utilizes features on mating surfaces of the adjacent modules that facilitate alignment and securing of modules in a single assembly action.

Advantageously, the modules can be easily assembled before mounting them within an enclosure or racks of industrial systems. Further, the technique also facilitates independent removal of such modules from the enclosure in a single action without disturbing the adjacent modules. For example, if maintenance or replacement of a module is required, the module can be independently removed from the enclosure by selectively disengaging the latch from the receiving slot and vertically sliding each module.

As will be appreciated by those skilled in the art, the above described implementations may be appropriately scaled and/or reinforced based upon the size of the modules. The techniques described above provides a simple assembly process for connecting modules while providing substantial cost savings achieved by reduced number of mechanical parts required for the locking mechanism.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An interlocking system for connecting a programmable logic controller and a power supply of an industrial control and automation system, the interlocking system comprising:
   a plurality of vertical slots and a latch disposed on a side surface of the power supply, wherein the latch comprises a first attachment feature disposed along a flexible tongue cantilevered proximate an opening in a housing of the power supply such that the tongue can flex into the opening; and
   a plurality of hooks and a second attachment feature formed on a side surface of the programmable logic controller, wherein the plurality of hooks are configured to slide along and engage with the plurality of vertical slots such that the programmable logic controller and the power supply are held together horizontally, and wherein the second attachment feature is configured to couple with the first attachment feature to resist disengagement of the plurality of hooks and the plurality of vertical slots.

2. The system of claim 1, wherein the system comprises at least two vertical slots formed adjacent to edges of the side surface of the power supply.

3. The system of claim 1, wherein the first and second attachment features comprise a detent and lug, respectively.

4. The system of claim 1, wherein the power supply comprises a 24 Volts AC power supply configured to power the programmable logic controller.

5. The system of claim 1, wherein the programmable logic controller comprises a port configured to receive a programmable module adapted to manage aspects of the programmable logic controller.

6. The system of claim 1, wherein each of the plurality of hooks and the latch comprises plastic.

7. The system of claim 1, wherein the latch, the second attachment feature, the plurality of vertical slots and the plurality of hooks facilitate alignment and securing together of the programmable logic controller and the power supply in a single assembly action.

8. The system of claim 1, wherein the first attachment feature is configured to slidably engage with the second attachment feature in response to sliding movement of the power supply relative to the programmable logic controller.

9. The system of claim 1, wherein the latch is coupled to the side surface of the power supply through an adhesive, or through a bolted coupling.

10. The system of claim 1, comprising support attachment features disposed on each of the power supply and the programmable logic controller, wherein the support attachment features are configured to facilitate coupling with a panel or rail.

11. A method for connecting a power supply to a programmable logic controller, the method comprising:
   abutting a mating surface of the programmable logic controller with a mating surface of the power supply;
   slidably engaging a plurality of hooks extending from one of the mating surfaces with corresponding vertical slots formed in the other of the mating surfaces; and
   engaging a latch cantilevered from the one of the mating surfaces with an attachment feature of the other mating surface such that the plurality of hooks and vertical slots are substantially prevented from slidably disengaging.

12. The method of claim 11, comprising mounting the assembled power supply and programmable logic controller on a panel.

13. The method of claim 11, comprising generating a sound by engagement of the latch with the attachment feature.

14. The method of claim 11, wherein a number and/or size of the plurality of hooks and corresponding vertical slots is configurable based upon the size of the first and second modules.

15. The method of claim 11, wherein the plurality of hooks extend from the mating surface of the programmable logic controller.

* * * * *